United States Patent [19]
Kumagai et al.

[11] Patent Number: 5,844,760
[45] Date of Patent: Dec. 1, 1998

[54] INSULATED-GATE CONTROLLED SEMICONDUCTOR DEVICE

[75] Inventors: Naoki Kumagai; Katsunori Ueno, both of Kawasaki, Japan

[73] Assignee: Fuji Electric Co., Ltd., Kawasaki, Japan

[21] Appl. No.: 1,199

[22] Filed: Jan. 7, 1993

Related U.S. Application Data

[63] Continuation-in-part of Ser. No. 854,085, Mar. 19, 1992, Pat. No. 5,303,110.

[30] Foreign Application Priority Data

| Mar. 22, 1991 | [JP] | Japan | 3-057495 |
| Dec. 4, 1991 | [JP] | Japan | 3-319459 |
| Jan. 16, 1992 | [JP] | Japan | 4-005252 |

[51] Int. Cl.$^6$ .................................................. H02H 9/00
[52] U.S. Cl. ................................................ 361/58; 361/18
[58] Field of Search ............................. 361/91, 58, 18, 361/93, 100, 111

[56] References Cited

U.S. PATENT DOCUMENTS

| 4,719,531 | 1/1988 | Okado et al. | 361/91 |
| 4,893,158 | 1/1990 | Mihara et al. | 361/91 |
| 4,937,471 | 6/1990 | Park et al. | 361/56 |
| 5,027,252 | 6/1991 | Yamamura | 361/58 |
| 5,303,110 | 4/1994 | Kumagai | 361/18 |

FOREIGN PATENT DOCUMENTS

| 2-130951 | 5/1990 | Japan . |

*Primary Examiner*—Ronald W. Leja
*Attorney, Agent, or Firm*—Finnegan, Henderson, Farabow, Garrett & Dunner, L.L.P.

[57] ABSTRACT

An insulated-gate controlled semiconductor device includes a main circuit that is controlled by an insulated gate having a gate resistor, an overload detector having the insulated gate for use in common with the main circuit, the overload detector being of the same construction as that of the main circuit, a current detector for detecting current passing through the overload detector, and a field effect transistor having a gate which responds to the voltage drop across the current detector. The main circuit is protected by lowering the voltage applied to the insulated gate through the gate resistor and through the low on-resistance of the field effect transistor while the field effect transistor is held on.

11 Claims, 6 Drawing Sheets

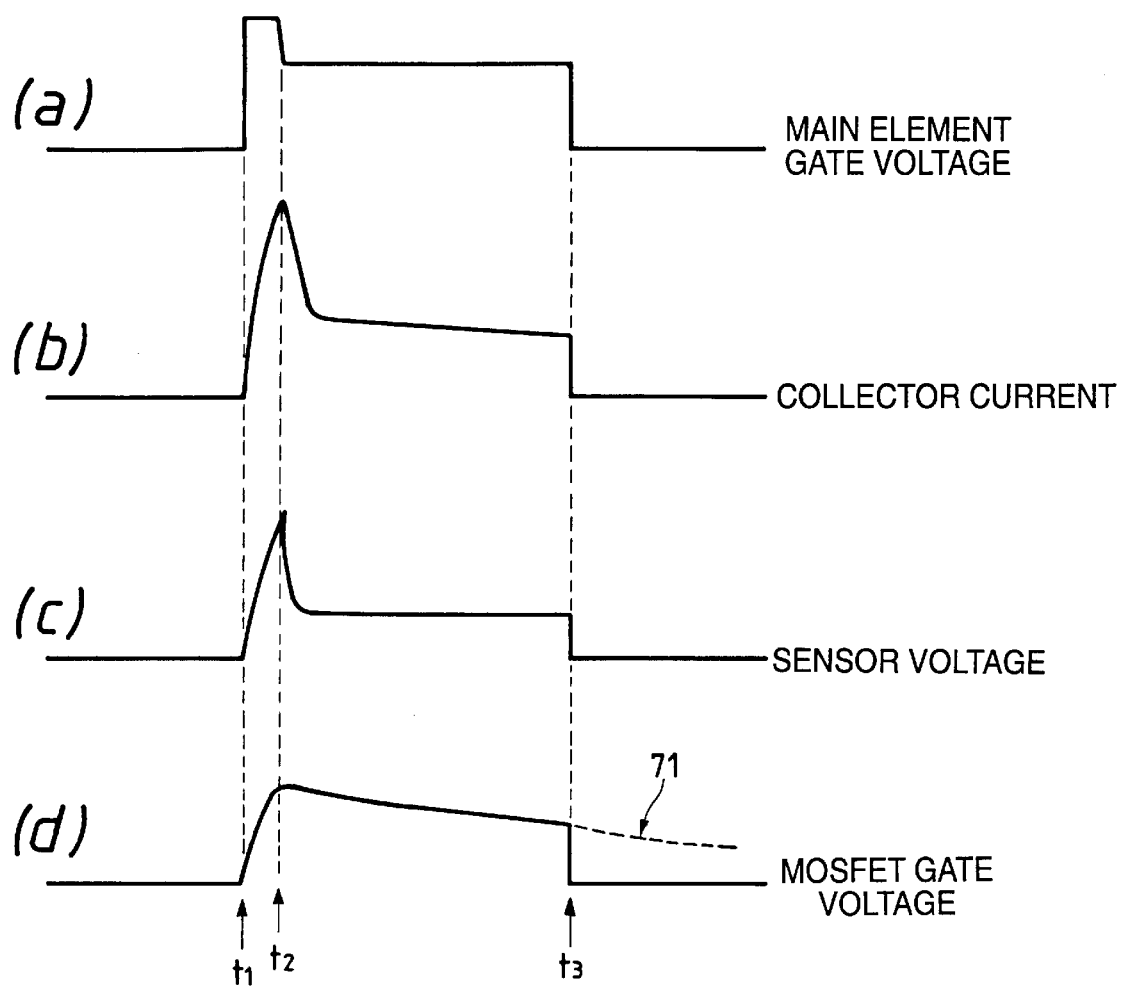

INSULATED-GATE CONTROLLED SEMICONDUCTOR DEVICE

This application is Continuation-In-Part of U.S. patent application Ser. No. 07/854,085 filed Mar. 19, 1992, in the name of Naoki KUMAGAI, now U.S. Pat. No. 5,303,110.

BACKGROUND OF THE INVENTION

1. Field of the Invention

The present invention relates to a semiconductor device controlled by an insulated gate, such as an insulated-gate bipolar transistor, which incorporates an overload protecting or latchup preventing function.

2. Discussion of the Related Art

Referring to FIG. 7, a general description will be given of a known insulated-gate bipolar transistor. The right half portion of FIG. 7 refers to the main body of circuit 10 of an insulated-gate bipolar transistor. An n-type epitaxial layer 113 grown to a predetermined thickness on a solid p-type substrate 111 via a solid n-type buffer layer 112 is used for a wafer or a chip. In addition, the surface of the epitaxial layer 113 is covered with a gate oxide film 114 and further provided with a gate film 115 made of polycrystalline silicon. The gate film 115 is patterned with a number of windows.

P-type base layers 11 and solid n-type emitter layers 12 for the main body 10 are diffused through the windows bored in the gate film 115. An emitter terminal 101 is led from an electrode film 116 for short-circuiting both semiconductor layers on the surface; a gate terminal 102 is led from a gate film 115; and a collector terminal 103 is led from an electrode film 166 beneath the substrate 111. As is obvious from FIG. 7, this insulated-gate bipolar transistor is a vertical type semiconductor device.

When a positive gate voltage is applied to the gate terminal 102 of the insulated-gate bipolar transistor thus constructed in this example, an n-channel is formed on the surface of the p-type base layer 11 beneath the gate film 115. Consequently, electrons are injected from the n-type emitter layers 12 via the formed n-channels to the n-type epitaxial layer 113. The conductivity modulation, based on the electrons thus injected, has the base current supplied to the vertical type pnp transistor including the p-type substrate 111, the n-type buffer layer 112, the epitaxial layer 113, and a p-type base layer 21. When the pnp transistor is turned on, current is caused to flow between the collector terminal 103 and the emitter terminal 101. Consequently, the insulated-gate bipolar transistor is held on.

The insulated-gate bipolar transistor is equivalent to a combination of a field effect transistor and a bipolar transistor and can be represented by the equivalent circuit shown in FIG. 8. Since the insulated-gate bipolar transistor has a four-layer thyristor construction of pnpn including the p-type substrate 111, the n-type buffer layer 112, the epitaxial layer 113, the p-type base layer 21, and an n-type emitter layer 22, a condition called latchup, which makes the control of the insulated gate ineffective, can arise if the thyristor conducts when overload or load-short-circuit occurs. A large current may then thermally break the transistor in a short time.

Latchup ensues from an overload or the like as described above and tends to arise if it is attempted to lower the loss internally caused to increase the performance of the insulated-gate bipolar transistor. In other words, though the amount of electrons to be injected into the epitaxial layer 113 may be increased by shortening the length of the channel beneath the gate film 116 to the advantage of reducing the loss incurred, the voltage drop produced in emitter short-circuit resistance in a portion which short-circuits the emitter layer 22 and the base layer 21 accelerates as the current flowing through the channel increases. Consequently, an npn-type parasitic transistor consisting of the n-type emitter layer 12, the p-type base layer 11, and the n-type epitaxial layer 113 conducts from the injection of the base current from the voltage drop. Thus, latchup is likely to occur.

In this way, breakdown due to latchup must be prevented in order to increase the performance of the insulated-gate controlled semiconductor device by reducing the loss internally caused and the on-state voltage. The present inventor has proposed means for solving the foregoing problems in Japanese Patent Application Unexamined Publication No. Hei. 3-97269. Referring to an equivalent circuit diagram of FIG. 8, the general description of the proposal will be given.

As shown in FIG. 8, there is provided a small-sized overload detector 20 or a current detecting cell similar in construction to the main body 10 of the insulated-gate controlled semiconductor device. The overload detector 20 may be fabricated by diffusing the p-type base layer 21 and the n-type emitter layer 22 through the windows of the gate film 115 for the main body 10 in the same manner as described with reference to FIG. 7. The gate terminal 102 and the collector terminal 103 may be used in common with the main body 10. A gate voltage 104 is applied via a gate resistor 30 to a common insulated gate 105 as shown in FIG. 8. Moreover, a current detecting means 40, such as a resistor, is connected to the emitter side of the overload detector 20 as shown in FIG. 8. A field effect transistor 50 whose gate is subjected to the voltage drop of the current detecting means is connected via a resistor 65, for example, to the insulated gate 105 for use in common with the main body 10 and the overload detector 20.

As shown in FIG. 7, the field effect transistor 50 is fabricated by diffusing a p-type well 51, a p-type well connecting layer 52, an n-type source layer 54 and an n-type drain layer 55 through the windows of the gate film 115 isolated from the main body 10.

When the insulated-gate controlled semiconductor device, as shown in the equivalent circuit of FIG. 8, enters the overload state as the load connected to the collector terminal 103 or the emitter terminal 101 short-circuits, for example, the current flowing into the overload detector 20 increases. Thus, the voltage drop of the current detecting means 40 increases. Since the gate of the field effect transistor 50 is subjected to the voltage drop, the transistor becomes operative when the voltage drop value reaches the threshold value of the gate and lowers the voltage applied to the insulated gate 105 by dividing the gate voltage 104 through the on-resistance, the resistor 65, and the gate resistor 30 to prevent latchup by restricting or cutting off the current flowing into the main body 10. In this case, the resistor 65 is used to set a dividing ratio of the gate voltage 104 to lower the voltage applied to the insulated gate 105, but it may be omitted as occasion demands.

Although latchup can be prevented theoretically in the insulated-gate controlled semiconductor device having the equivalent circuit of FIG. 8, the withstand voltage of the field effect transistor 50 actually tends to be deficient. Consequently, while the insulated-gate controlled semiconductor device is held off, latchup may develop in the field effect transistor 50. Moreover, the overload protective operation of the field effect transistor 50 may concur to produce unnecessary oscillation when the load of the insulated-gate controlled semiconductor device shows a short-circuit.

The reason for the first problem lies in the fact that because the p-type well 51 of the field effect transistor 50 of FIG. 7 together with the respective p-type base layers 11 and 21 are diffused during the manufacturing process, the impurity concentration remains too high for the field effect transistor. In other words, the impurity concentration in the main body 10 has to be set to at least about $10^{17}$ atoms/cm$^3$ to reduce the emitter short resistance as much as possible with the emitter layer 12 in view of latchup prevention. The above-specified impurity concentration is also used to set the operating threshold value of the insulated gate to within the range of 3 to 6 V. Consequently, if the impurity concentration in the p-type well 51 of the field effect transistor 50 is set to suit the p-type base layer 11 of the main body 10, its withstand voltage will become 10 V or thereabout. Since it is necessary to apply a gate voltage 104 of about 15 V to the insulated-gate controlled semiconductor device to ensure its definite operation, the field effect transistor will not operate properly if its withstand voltage is lower than 15 V. Moreover, the setting of the impurity concentration in the p-type well 51 to a concentration different from that provided in the p-type base layer 11 is extremely disadvantageous in view of the manufacturing process.

The reason for the second problem lies in the fact that the field effect transistor, though it is of a horizontal type, is incorporated in the same chip affiliating the main body 10 and the overload detector 20. Consequently, there exits a vertical type thyristor of pnpn construction including the p-type substrate 111, the n-type buffer layer 112, the n-type epitaxial layer 113, the p-type well 51 of the field effect transistor, and the n-type drain layer 55. If, therefore, the parasitic thyristor is turned off while the insulated-gate controlled semiconductor device is held off, latchup will arise. Since few carriers in the epitaxial layer 113 of FIG. 7, holes in this example, are apt to flow into the well 51, the potential with respect to the drain layer 55 tends to rise. As the drain terminal 106 and the source terminal 107 are rendered at the same potential, the junction between the well 51 and the drain layer 55 is set in the forward bias state and thereby the parasitic thyristor is likely to be easily turned on.

The reason for the third problem lies in the fact that when the field effect transistor 50 is turned on and lowers the potential of the common insulated gate 105 during the overload protective operation, the current flowing through the overload detector 20 decreases, thus decelerating the voltage drop of the current detecting means 40. As a result, the gate voltage of the field effect transistor 50 decreases while its on-resistance increases and the potential of the insulated gate 105 rises, thus increasing the current in the main body. When the overload current flowing through the main body is large at the time of short-circuiting of the load, this process is repeated and oscillation is liable to occur.

SUMMARY OF THE INVENTION

A semiconductor device according to the present invention exhibits an input impedance considerably higher than what is manifested by a conventional bipolar transistor because the on/off state and the like are controlled by an insulated gate. Moreover, advanced integrated circuit technology may be utilized to provide a composite semiconductor device of extra-fine pattern construction to make available extremely high operating speeds and particularly high switching speeds. The advantage of such a composite semiconductor device results in a rapid increase in the range of its use as a discrete semiconductor device fit for high frequency, high voltage, or large current use.

The present invention has been made in view of the above circumstances and has as an object to prevent the occurrence of breakdown resulting from insufficient withstand voltage in a field effect transistor because of the gate voltage applied to an insulated gate of an insulated-gate controlled semiconductor device.

Another object of the present invention is to prevent the occurrence of latchup in a field effect transistor while an insulated-gate controlled semiconductor device is held off.

Another object of the present invention is to prevent unnecessary oscillation from being generated during the protective operation of the insulated-gate controlled semiconductor device.

A further object of the present invention is to provide a short protective circuit capable of turning on or reactivating an overload detector element by means of a drive signal even when the drive voltage or current, reduced to prevent the main current of the main element from oscillating during the time the protective circuit operates, is restrained from increasing.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the first object and in accordance with the purpose of the invention, as embodied and broadly described herein, the insulated-gate controlled semiconductor device of this invention comprises a main body controlled by an insulated gate having a gate resistor, an overload detector having the insulated gate for use in common with the main body, the overload detector being of the same construction as that of the main body, current detecting means for detecting current passing through the overload detector, and a field effect transistor having a gate which accedes to the voltage drop of the current detecting means and whose drain is connected to the insulated gate. The main body is protected by lowering the voltage applied to the insulated gate through the on-resistance and the gate resistance of the field effect transistor while it is held on. A constant-voltage means is inserted between the field effect transistor and the insulated gate or the drain layer of the field effect transistor is constructed so that the drain layer is formed of a composite layer with a high concentration layer enclosed in a low concentration layer.

To achieve the second object and in accordance with the purpose of the invention, as embodied and broadly described herein, the insulated-gate controlled semiconductor device of this invention comprises a similar main body, an overload detector, a current detecting means, and a field effect transistor. The main body is protected by lowering the voltage applied to an insulated gate through the on-resistance and the gate resistance of the field effect transistor while it is held on. A protective diode is inserted between the gate of the field effect transistor and the insulated gate and caused to conduct when voltage that turns off the main body is applied to the insulated gate in order to prevent the field effect transistor from malfunctioning, or the field effect transistor is enclosed with a guard ring layer of the same conductive type for diverting carriers flowing into the well. Moreover, the protective diode may be inserted between the field effect transistor and the insulated gate or connected to the current detecting means in series in such a direction as to impede the gate voltage having polarity that turns off the main body in either case.

To achieve the third object, the insulated-gate controlled semiconductor device of this invention comprises a main body, an overload detector, current detecting means, and a field effect transistor, the main body being protected by lowering the voltage applied to the insulated gate through an on-resistance and the gate resistance of the field effect transistor while it is held on. The voltage drop of the current detecting means is supplied via a diode to the gate of the field effect transistor solely in the charging direction. A parallel discharge resistor having a greater resistance may be connected, if necessary, to a charging diode for use as the gate of the field effect transistor.

To achieve the fourth object, a short protective circuit is provided comprising a main switching element having a control electrode, a first main electrode and a second main electrode to be driven by a signal applied from a control terminal to its control electrode, and a switching element having a control electrode, a first main electrode and a second main electrode for current detection, the control electrode and the first main electrode of the switching element being respectively connected to the control electrode and the first main electrode of the main switching element, the second main electrode of the switching element being connected via a current detecting resistor to the second main electrode of the main switching element to reduce the drive signal directed to the main switching element by turning on a discharge switching element inserted in a branch circuit of the circuit extended from the control terminal to the control electrode of the main switching element when excessive current flows through the current detecting resistor, and to retain the reduced drive signal even when the excess current flowing through the main switching element is suppressed as the drive signal decreases is adapted to turn off the discharge element when the signal applied to a drive terminal becomes zero or opposite in polarity after the drive signal is reduced by turning on the discharge switching element.

A first embodiment is disclosed wherein the constant-voltage means is inserted between the field effect transistor and the insulated gate is designed to prevent the breakdown of the field effect transistor by dropping the gate voltage using the constant-voltage means to reduce the voltage applied to the field effect transistor. A second embodiment is disclosed wherein the drain layer of the field effect transistor is made of a composite layer with the high concentration layer enclosed within the low concentration layer. This embodiment is intended to prevent the breakdown of the field effect transistor due to the gate voltage by making a depletion layer readily spread in the low concentration layer to improve the withstand voltage of the field effect transistor.

A third embodiment is disclosed wherein the protective diode is inserted between the gate of the field effect transistor and the insulated gate. The third embodiment is designed to prevent the field effect transistor from malfunctioning by causing the protective diode to conduct when the gate voltage that turns off the main body is applied to the insulated gate. A fourth embodiment also is disclosed wherein the field effect transistor is enclosed with the guard ring layer. This embodiment is intended to have a parasitic thyristor hardly turned off by diverting carriers flowing into the well thereto to prevent the latchup of the field effect transistor while the insulated-gate controlled semiconductor device is held off.

In the fifth embodiment, the voltage drop of the current detecting means is supplied via the charging diode to the gate of the field effect transistor. The current flowing through the main body is prevented from increasing again to prohibit the oscillation by obstructing rapid discharge at the gate of the field effect transistor. This is done by using the charging diode to hold the potential of the insulated gate at low levels when the current flowing from the overload detector into the current detecting means decreases as the potential of the insulated gate lowers while the field effect transistor is held on.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

FIG. 10 is voltage waveforms illustrating the operation of the sixth embodiment when a short occurs across a load.

DETAILED DESCRIPTION OF THE PREFERRED EMBODIMENTS

Reference will now be made in detail to the presently preferred embodiments of the invention, examples of which are illustrated in the accompanying drawings. Wherever, possible, the same reference numbers will be used throughout the drawings to refer to the same or like parts.

Figure 6:
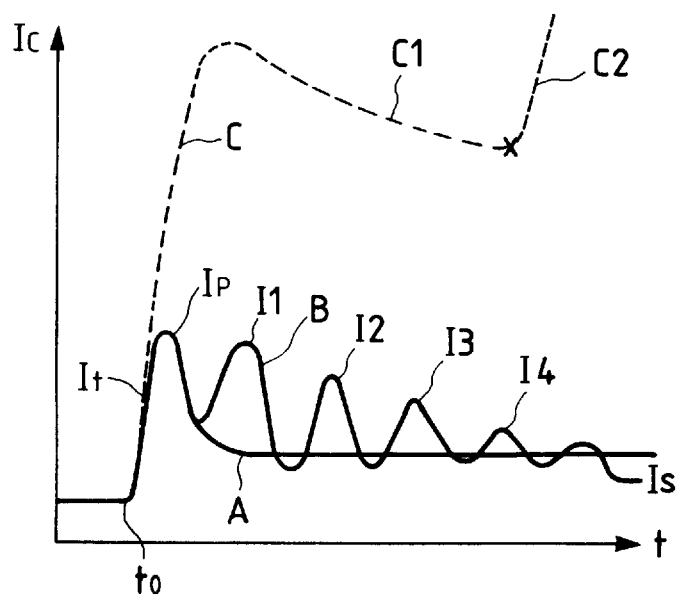
FIG. 6 is a waveform of a collector current in a main body as it varies with time when a short-circuit occurs in the load of an insulated-gate controlled semiconductor device according to the fifth preferred embodiment of the invention, and a comparison waveform of the conventional device.
Figure 7:
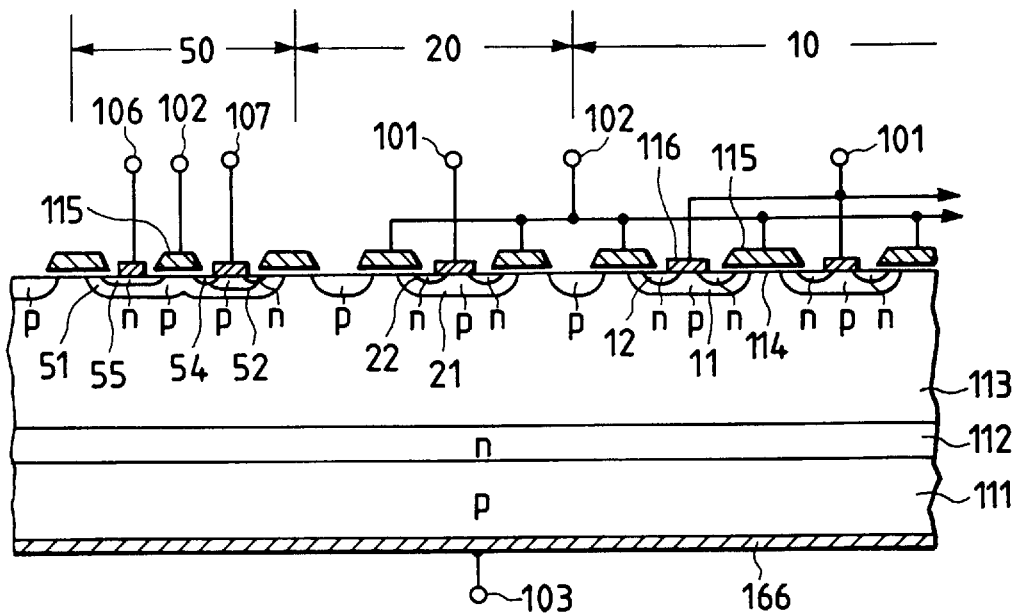
FIG. 7 is a sectional view of the principal part of a wafer extensively illustrating a main body, an overload detector and a field effect transistor constituting the general construction of an insulated-gate controlled semiconductor device.

Referring to FIGS. 1 to 5, the first to fifth embodiments of the present invention will subsequently be described. FIG. 6 shows a current waveform in the fifth embodiment as compared with a conventional device. The general construction of an insulated-gate controlled semiconductor device in these embodiments is shown in FIG. 7. The insulated-gate controlled semiconductor device in any one of the embodiments is assumed to be an insulated-gate bipolar transistor.

Figure 1:
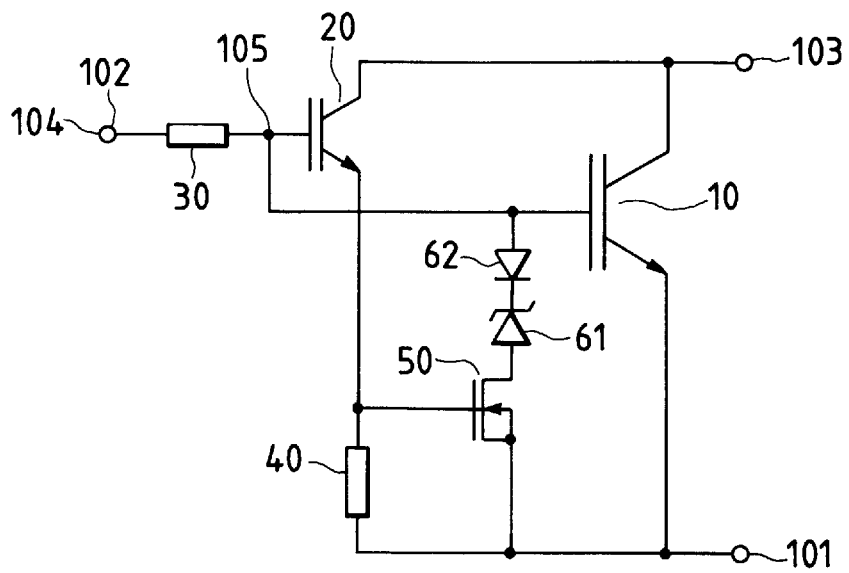
FIG. 1 is an equivalent circuit diagram of an insulated-gate controlled semiconductor device according to a first preferred embodiment of the invention.
Figure 8:
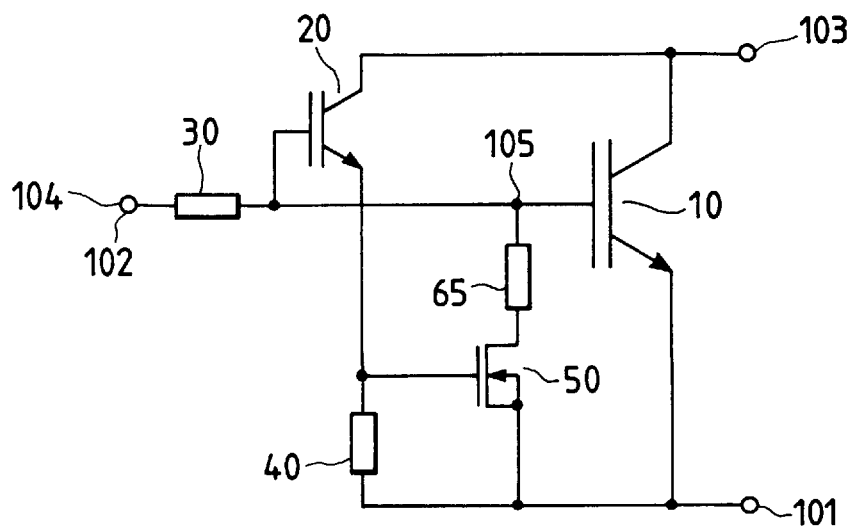
FIG. 8 is an equivalent circuit diagram of a prior art insulated-gate controlled semiconductor device.

FIG. 1 illustrates a first embodiment in the form of an equivalent circuit corresponding to what is shown in FIG. 8. The difference between FIG. 1 and FIG. 8 lies in the fact that, in place of a conventional resistor 65, a constant-voltage means 61 such as a Zener diode, for instance, and a protective diode 62 are connected between an insulated gate 105 and the drain of a field effect transistor 50 in series. The insulated gate 105 is for use in common with a main body 10 and an overload detector 20. The withstand voltage of the field effect transistor 50 for use in this embodiment may be as low as approximately 10 V, whereas the constant-voltage means 61 may have an avalanche or Zener voltage of approximately 5 to 10 V, for example. Further, it may be advantageous for the constant-voltage means 61 and the protective diode 62 to be prepared by doping a polycrystalline silicon film for the gate film 115 of FIG. 5 with impurities before being incorporated into the insulated-gate controlled semiconductor device.

When a positive gate voltage 104 of about 15 V is applied to a gate terminal 102 to turn on the insulated-gate controlled semiconductor device of FIG. 1, only the voltage resulting from the following process is applied to the field effect transistor 50. This voltage is obtained by subtracting the avalanche voltage of the constant-voltage means 61 and the forward voltage of the protective diode 62 from the gate voltage 104 and dividing the difference through the off-resistance of the field effect transistor 50 and a gate resistor 30. Consequently, the field effect transistor 50 with the low withstand voltage in the embodiment shown can be set free from breakdown and used in normal state. When a large current flows into the main body 10 as the load short-circuits, the voltage drop in the current detecting means 40, which receives current passing through the overload detector 20, is applied to the gate of the field effect transistor 50. The field effect transistor 50 is then turned on with the effect of lowering the voltage applied to the insulated gate 105.

Although it is desirable to fade away the gate voltage 104 to turn off the insulated-gate controlled semiconductor device of FIG. 1, the gate voltage 104 may also be switched to the negative to ensure the off-operation. Even when the gate voltage 104 is simply faded, the potential of the gate terminal 102 may otherwise become negative with respect to an emitter terminal 101 because of the reaction of an inductive load accompanying the off-operation. In these cases, the field effect transistor 50 may malfunction and induce latchup. The protective diode 62 is used to prevent such incidents and to impede the current flow through a parasitic diode in the field effect transistor 50.

Figure 2:
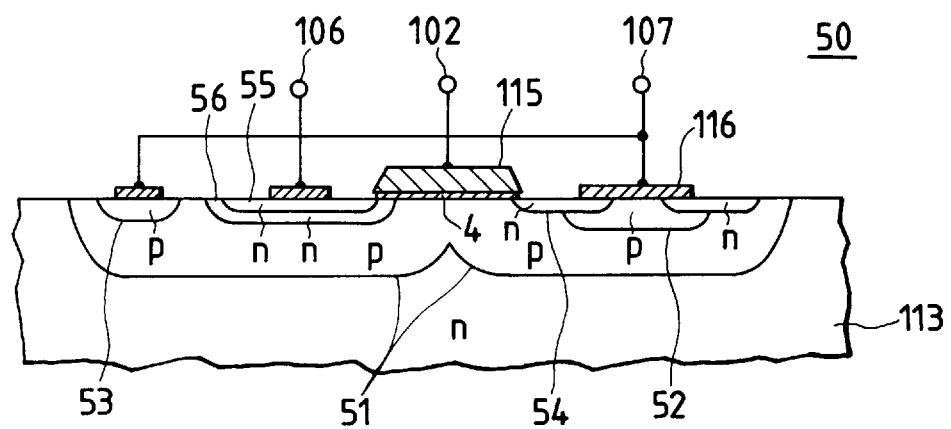
FIG. 2 is an enlarged sectional view of a field effect transistor according to a second preferred embodiment of the invention.

FIG. 2 is an enlarged sectional view of the field effect transistor 50 of a second embodiment. The location of FIG. 2 corresponds to the left side of FIG. 7. According to the second embodiment, an n-type drain layer of the field effect transistor 50 is formed of a composite layer, which consists of a high concentration drain layer 55 and a low impurity concentration drain layer 56. The high concentration drain layer 55 has an impurity concentration of at least $10^{19}$ atoms/cm$^3$ and is enclosed by the low impurity concentration drain layer 56 which has an impurity concentration of about $10^{17}$ atoms/cm$^3$. The withstand voltage of the field effect transistor 50 is thus improved.

The high concentration layer 55 and the low concentration layer 56 preferably should be diffused to a depth of about 0.5 $\mu$m and about 1 $\mu$m, respectively. Although these layers may be diffused through two processing steps, it is advantageous to cut them to different depths simultaneously by thermal diffusion. The thermal diffusion should occur after arsenic and phosphorus impurities have been respectively introduced into the high concentration layer 55 and the low concentration layer 56 by ion injection. In the example of FIG. 2, moreover, a similar p-type high impurity concentration well connecting layer 53 is formed on the side of the drain layers 55 and 56 in a p-type well 51 and connected to a source terminal 107.

The insulated-gate controlled semiconductor device according to the second embodiment may be similar to what is shown in FIG. 8 or an equivalent circuit excluding the resistor 65. When a gate voltage 104 of about 15 V is applied to the gate terminal 102 of FIG. 8 and when the voltage at the same level is applied between the drain terminal 106 and the source terminal 107 of the field effect transistor 50, the withstand voltage of the field effect transistor 50 is readily improved. The withstand voltage becomes 15 V or higher as a depletion layer extends in the low concentration drain layer 56 because of the junction between the p-type well 51 and the n-type low concentration drain layer 56. This occurs even though the well 51 has a relatively high impurity concentration of about $10^{17}$ atoms/cm$^3$ or greater.

The well connecting layer 53 plays the role of preventing the pn junction with the drain layer 56 from being biased in the forward direction, and therefore from being prone to latchup as the potential of the well 51 rises, by having the holes flowing from the epitaxial layer 113 into the well 51 bypass the drain layers 55 and 56 while the insulated-gate controlled semiconductor device is held off.

Figure 3:
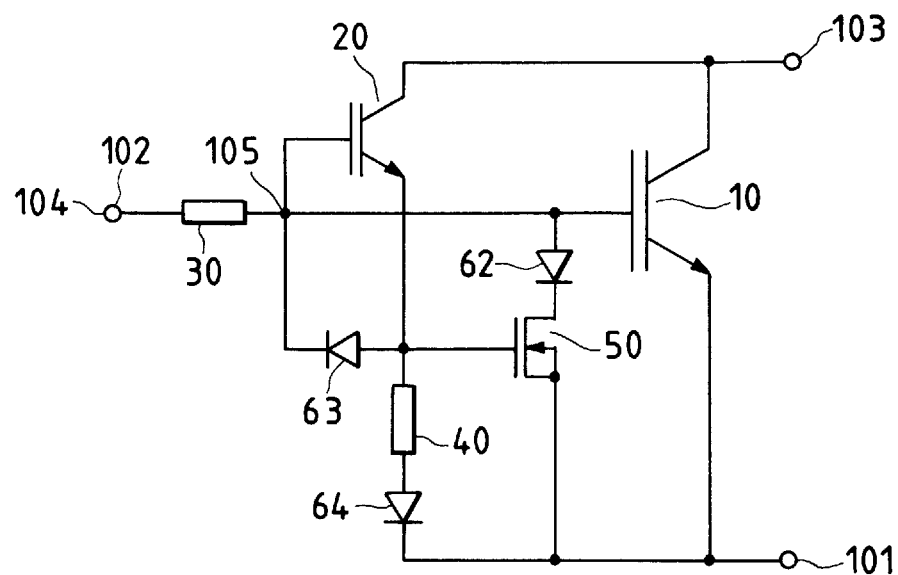
FIG. 3 is an equivalent circuit diagram of an insulated-gate controlled semiconductor device according to a third embodiment of the invention.

FIG. 3 shows a third embodiment in the form of an equivalent circuit. While the insulated-gate controlled semiconductor device is held off, latchup is prevented by the protective diode 62. The difference between the equivalent circuit of FIG. 3 and the prior art of FIG. 8 is the inclusion of the protective diode 62, as described above with reference to FIG. 1, in place of the resistor 65 between the field effect transistor 50 and the insulated gate 105. Further differences include the connection of a protective diode 63 between the insulated gate 105, the overload detector 20, and the current detector 40, and the connection of a diode 64 between the current detector 40 and the emitter terminal 101.

When a negative gate voltage 104 is applied to the gate terminal 102 to turn off the insulated-gate controlled semiconductor device, latchup may be induced by the malfunction of the field effect transistor 50. Alternatively, latchup may be induced by the malfunction of the field effect transistor 50 when the potential of the emitter terminal 101 becomes higher than that of the gate terminal 102 due to the reaction of the inductive load when the device is turned off by fading the gate voltage 104. However, by diverting to the gate terminal 102 the current flowing from the overload detector 20 to the current detecting means 40, the protective diode 63 prevents the occurrence of latchup as the field effect transistor 50 is turned on misguidedly. The diode 64 is then used to keep any useless current from flowing from the emitter terminal 101 via the current detecting means 40, the protective diode 63, and the gate resistor 30 to the gate terminal 102.

As is readily understood, both of the protective diodes 62 and 63 are not necessarily required to be provided according to the third embodiment. The provision of either protective diode 62 or 63 is effective in preventing latchup to a certain extent. The diode 64 may be installed as occasion demands.

Figure 4:
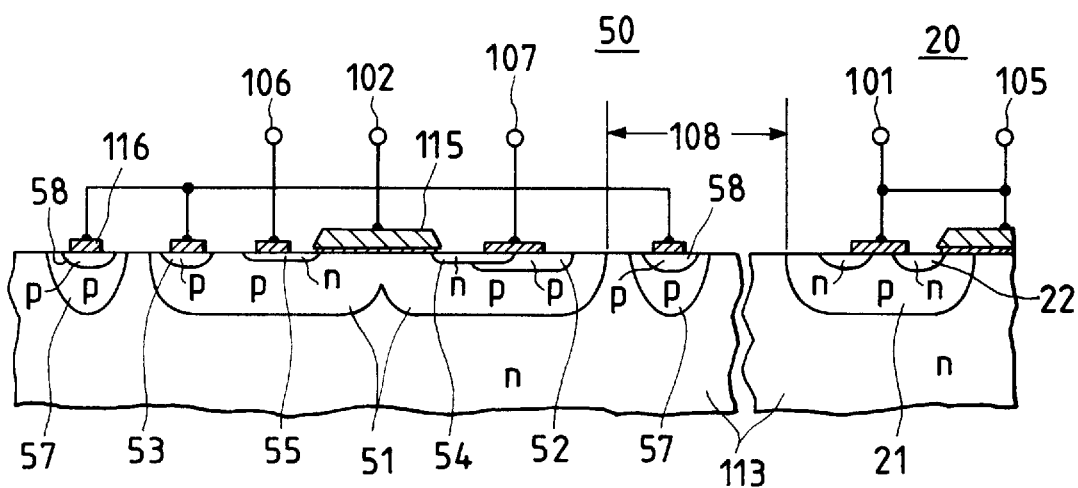
FIG. 4 is an enlarged sectional view of a field effect transistor according to a fourth embodiment of the invention.

FIG. 4 is an enlarged sectional view of the field effect transistor 50 as a fourth embodiment. In order to prevent latchup, a guard ring layer 57 is provided in such a way as to surround the well 51 of the field effect transistor 50. The guard ring layer 57 is of the same p-type as that of the well 51 and may be formed simultaneously with the well 51 by diffusion. It is preferred to diffuse a p-type high impurity concentration guard ring connecting layer 58 on the surface. In the example of FIG. 4, the well connecting layer 53 is formed on the side of the drain layer 55 of the well 51, as in the case of FIG. 2. The well connecting layer 53 and the guard ring connecting layer 58 are of the same p-type and may be diffused simultaneously. The well connecting layer 53 and the guard ring connecting layer 58 are both connected to the source terminal 107, as shown in FIG. 4.

While the insulated-gate controlled semiconductor device is held off, the inflow amount of holes flowing from the epitaxial layer 113 to the well 51 decreases as they are diverted to the guard ring layer 57. As shown in FIG. 4, the holes which have flowed into the well 51 are drawn toward the well connecting layer 53. Thus, the amount of holes entering the drain layer 55 is conspicuously reduced. As a result, the junction between the well 51 and the drain layer 55 is prevented from being biased distinctly in the forward direction. Latchup is therefore effectively prevented according to this embodiment. If, moreover, the space 108 between the well 51 of the field effect transistor 50 and the base layer 21 of the overload detector 20 is correspondingly set to the same as or slightly above the diffusion length of holes as a small number of carriers in the epitaxial layer 113, latchup will be completely prevented.

Figure 5:
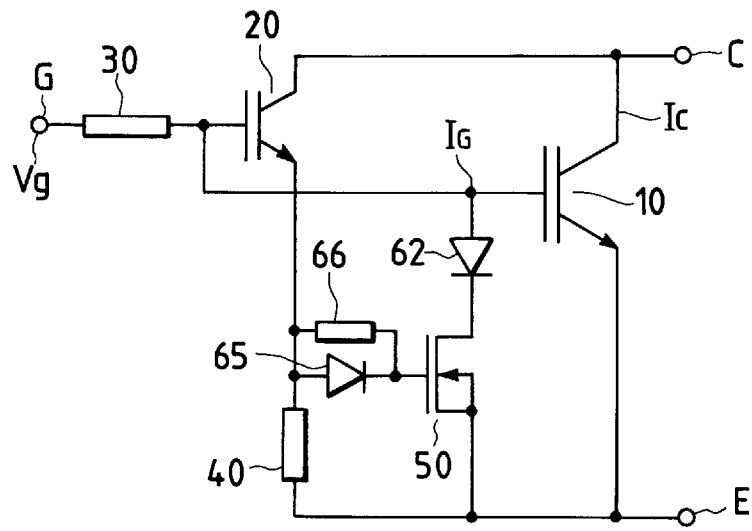
FIG. 5 is an equivalent circuit diagram of an insulated-gate controlled semiconductor device according to a fifth preferred embodiment of the invention.

FIG. 5 shows the fifth embodiment of the invention in the form of an equivalent circuit. In this embodiment, a charging diode is used to prevent oscillation which is likely to occur when the load of the insulated-gate controlled semiconductor device short-circuits. The difference between the equivalent circuit of FIG. 5 and the prior art of FIG. 8 is the inclusion of the charging diode 65 connected between the current detecting means 40 and the gate of the field effect transistor 50. In the example of FIG. 5, a high-resistant discharge resistor 66 is connected to the charging diode 65 in parallel and the protective diode 62 is connected between the field effect transistor 50 and the insulated gate IG as in the case of FIG. 3.

While the insulated-gate controlled semiconductor device is in the normal on-state with the gate voltage Vg applied at the gate terminal G, the current detecting means 40 causes a slight voltage drop to occur because of the current flowing from the overload detector 20. Also, the charging diode 65 not only conducts but also supplies the voltage drop to the gate of the field effect transistor 50. When the load of the insulated-gate controlled semiconductor device short-circuits, for instance, thus making a large collector current Ic flow through the main body 10, the current flowing from the overload detector 20 into the current detecting means 40 increases correspondingly. As the voltage drop also increases, the field effect transistor 50 instantly receives the large voltage drop via the charging diode 65 at its gate and is turned on. Accordingly, the field effect transistor with the low on-resistance lowers the potential of the insulated-gate IG and simultaneously decreases the collector current Ic flowing into the main body 10.

The current received at the current detecting means 40 from the overload detector 20 also decreases accordingly, and the charging diode 65 receives the gate potential of the field effect transistor 50 in the reverse bias direction and operates to prevent discharging. As a result, the field effect transistor 50 enters a state where the gate remains charged and holds the potential of the insulated gate IG at low levels with low on-resistance and restricts the collector current Ic in the main body 10. Since the charging diode 65 allows some reverse leakage current in this case, the gate of the field effect transistor is gradually discharged. However, the charged condition is sufficiently maintained to restrict the collector current Ic. The reverse leakage current of the charging diode 65 is still subject to variation and it is necessary to restore the gate potential of the field effect transistor 50 to the original condition with certainty after the overload condition of the main body 10 is cancelled. Thus, the discharge resistor 66 is desired to be connected to the charging diode 65 in parallel, as shown in the embodiment of FIG. 5. The resistance of the discharge resistor 66 should preferably be as high as several hundred kilo-ohms (k$\Omega$) to several mega-ohms (M$\Omega$).

FIG. 6 shows a waveform of the collector current Ic in the main body 10 as it varies with time after the load in the fifth embodiment short-circuits. For reference, waveforms B and C are also shown for cases where the collector current Ic oscillates and where it is not restricted as in the prior art of FIG. 7, respectively. First, the waveform C will be described. The collector current Ic sharply rises after a short-circuit occurs at time t0 and then gradually falls slightly as shown by C1 under the influence of the heated channel portion and the like. Subsequently, the current suddenly increases again as shown by C2 after latchup occurs at a point X in FIG. 67 thus causing breakdown.

In the case of the waveform B where the load short-circuits without the provision of the charge diode 65 of FIG. 5, field effect transistor 50 is turned on when the collector current reaches It in FIG. 6. Normally this occurs 1–2 $\mu$S after t0 so as to lower the potential of the insulated gate IG, whereby the collector current Ic decreases after the first peak Ip. However, the voltage drop of the current detecting means 40 is also simultaneously reduced and the gate of the field effect transistor is discharged to increase the on-resistance. Accordingly, the potential of the insulated gate IG is raised, so that the collector current Ic is increased again. The collector current Ic repeats the increasing and decreasing process with a period of several $\mu$S to cause the oscillating waveform B. This oscillation normally develops into an oscillating damping waveform, as shown in FIG. 6, and its value becomes ultimately stable, as shown by Is. Nevertheless, the high current peaks at I1–I4 to considerably damage the insulated-gate controlled semiconductor device.

In the case of waveform A in the fifth embodiment, the collector current Ic continues to increase up to It, and after the field effect transistor 50 is turned on, the charged state of the gate is held as described above to hold the insulated gate IG at low potential levels. Consequently, the collector current Ic quickly decreases down to the stabilized current Is after reaching first peak Ip, as shown in FIG. 6. The collector current Ic flowing through the main body 10 of the insulated-gate controlled semiconductor device is prevented from unnecessarily oscillating at the time the load short-circuits. Thus, the insulated-gate controlled semiconductor device is safely protected according to the fifth embodiment.

Although the fifth embodiment adequately solves the problem of oscillation, another potential problem may arise which is explained as follows.

The resistance 66 in the circuit of FIG. 5 should be great enough to hold a constant amount of charge at the gate of the field-effect-transistor 50 for a certain period of time until the external circuit operates. Nevertheless, the field-effecttransistor 50 remains in the ON state as the charge is held therein even when attempting to turn on or re-activating the overload detector element 20 by applying the gate signal thereto after the external circuit has operated. Accordingly, sufficient gate voltage is not applied to the main body 10, which consequently operates at high impedance, and while incurring loss and causing its temperature to rise, the device may result in damage.

A problem such as the above may arise even in a short protective circuit using not only a bipolar transistor as a switching element but also a discharge element for shunting the base current in a case where a short occurs across the load.

Figure 9:
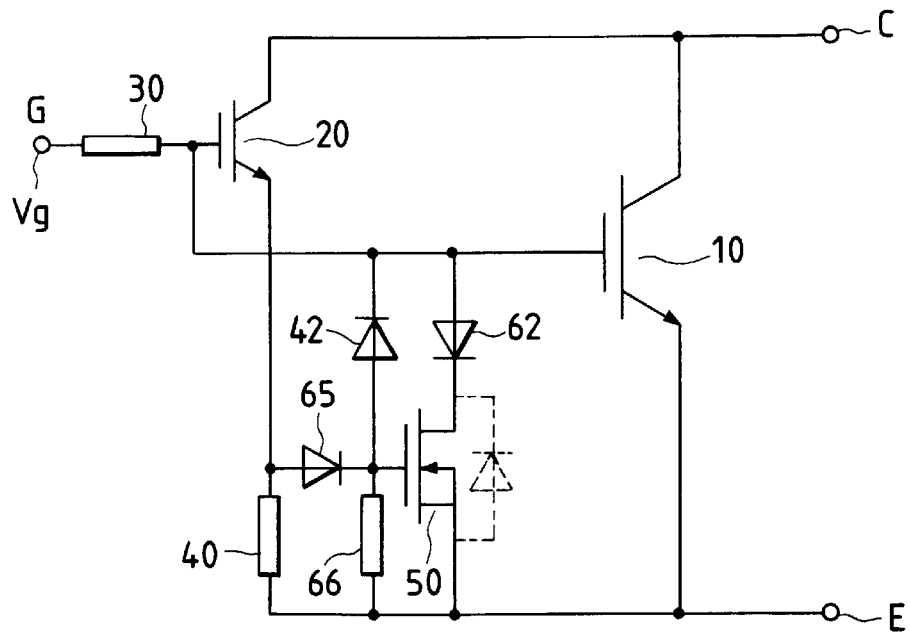
FIG. 9 is an equivalent circuit diagram of an insulated-gate controlled semiconductor device according to a sixth preferred embodiment of the invention.

FIG. 9 illustrates the sixth embodiment of the present invention. FIG. 9 shows a short protective circuit for an IGBT. In this circuit, a reset diode 42 is connected between the gate of the discharge MOSFET 50 and the gate of the IGBT element (main body) 10 of FIG. 5. FIG. 10 shows the operation of this circuit when a short occurs. In FIG. 10, (a) represents the gate voltage of the main element 10, (b) represents the collector potential of the main element 10, (c) represents a voltage drop of a current detecting resistor 40, that is, sensor current, and (d) represents the gate voltage of the discharge MOSFET 50. Assuming a short occurs across a load at time t1, the collector currents of the main element 10 and that of detector element 20 for current detection sharply increase thereafter.

Simultaneously, the sensor voltage also rises, causing the protective circuit to operate at time t2. Similar to the sensor voltage, the gate voltage of MOSFET 50 rises from time t1 to t2. The protective circuit operates to restrict the main current as shown by (b) after time t2. The sensor voltage also drops after time t2, though diode 65 and a resistor 66 hold the gate voltage of MOSFET 50. The voltage applied by an external circuit to the gate of the main element is lowered at time t3 and the gate voltage of the main element lowers. In this case, the gate voltage of MOSFET 50 gently reduces as shown by a dotted line 71 since the charge at the gate of MOSFET 50 is allowed to flow only through the resistor 66 in the protective circuit of FIG. 9. However, the diode 42 added to the path extended to the gate of the main element 10 in the case of the protective circuit of FIG. 9 also causes the gate voltage of the discharge MOSFET to be reset to 0V when the gate signal becomes 0V at time t3. In other words, though the protective circuit of FIG. 5 keeps operating after t3, the protective circuit in FIG. 9 can be reset simultaneously when the external circuit operates to set the voltage applied to the gate terminal G to 0V, so that the reset operation becomes possible instantly. Also, the discharge resistor 66 may be connected to the diode 65 in parallel as shown in FIG. 5 but should preferably be connected to the emitter terminal side of the resistor 40 to avoid the resetting of MOSFET 50 because the potential on the side of the detector element 20 of the current detecting resistor 40 is too high.

Figure 11:
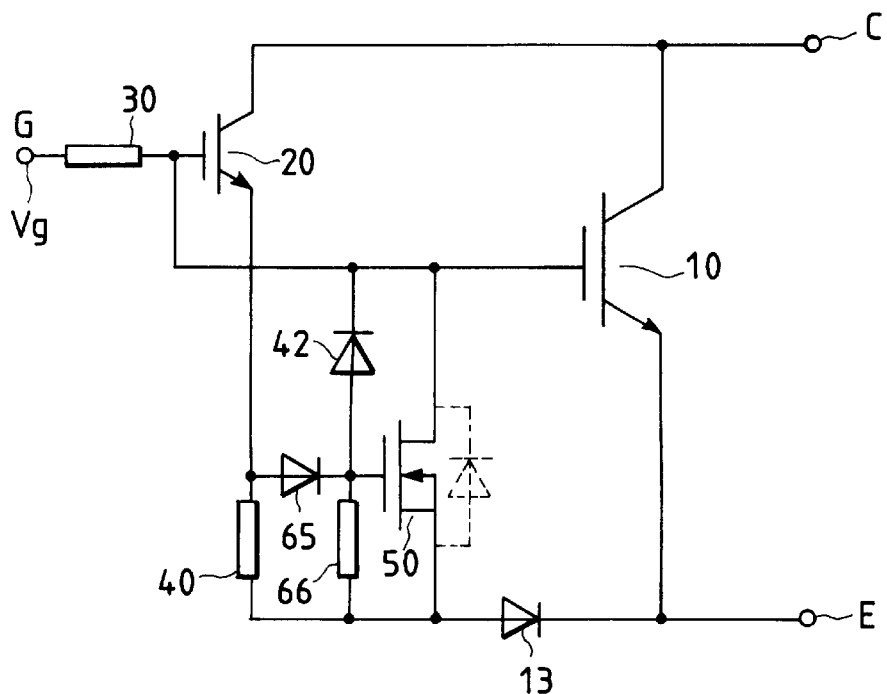
FIG. 11 show.,s a modified embodiment of the sixth embodiment to prevent undersirable current flow.

Often, the voltage applied to the gate terminal G is not reduced to 0V but is biased negatively in order to turn off the main element 10. In this case, the current is allowed to flow undesirably from the emitter terminal E through the diode 42 to the gate terminal G in the circuit as shown in FIG. 9. FIG. 11 shows an embodiment of a protective circuit designed to prevent such current flow.

Referring to FIG. 11 the current detecting resistor 40, the discharge resistor 66 and MOSFET 50 are connected to a common reverse-blocking diode 13. Therefore, the current cannot flow from the emitter E to the gate G even when a negative bias is applied to the gate. The reverse-blocking protective diode 62 of FIG. 9 has been omitted in this circuit. However, such a diode may be used with different reverse-blocking diodes respectively connected to the current detecting resistor 40 and to the emitter terminal side of discharge resistor 66.

The present invention operates effectively whether the drive signal is in the form of a voltage or a current. With a MOSFET as the discharge switching element, the present invention also operates effectively even when means for reducing the time required for the gate of the discharge MOSFET to charge and for prolonging the discharge time is inserted in a circuit including the gate electrode of the discharge MOSFET for maintaining the reduced drive signal when the overcurrent is suppressed, the second main electrode of the switching element for current detection, and the second main electrode of the main switching element.

It is also effective to use a discharge resistor connected to a diode that is connected to the current detecting resistor side of the switching element for current detection and to the second main electrode of the main switching element as the means for reducing the time required for the gate of the discharge MOSFET to charge and for prolonging the discharge time. It is still effective to turn off the discharge MOSFET when the drive signal applied to the drive terminal becomes zero or opposite in polarity after the signal is reduced by connecting the diode between the gate of the discharge MOSFET and the control electrode of the main switching element. In such a case, the branch circuit including the discharge MOSFET, the current detecting resistor and the discharge resistor may be connected via respective reverse blocking diodes to the second main electrode of the main switching element or otherwise the discharge MOSFET, the current detecting resistor and the discharge resistor may be connected via a common reverse-blocking diode to the second main electrode of the main switching element.

Moreover, the aforementioned short protective circuit may be constructed so that the main switching element and the switching element for current detection are formed on the same semiconductor substrate. When the signal applied by the external circuit to the drive terminal becomes zero or opposite in polarity after the short protective circuit operates, the short protective circuit is reset if the discharge switching element is turned off in such a way that with MOSFET used as that discharge switching element, for instance, the charge accumulated at its gate is discharged through the diode connected to the control electrode of the main switching element. Hence, the main switching element can be operated instantly by the signal applied to the drive terminal again.

Although a description has been given of a short protective circuit for IGBT in the embodiments shown, the present invention can be implemented likewise in a short protective circuit for a MOSFET and a bipolar transistor for shunting the base current via a discharge MOSFET when overcurrent flows and the like.

As set forth above, any one of the embodiments described is suitable for application to an insulated-gate controlled semiconductor device as a discrete large capacity element having a withstand voltage of several hundred volts and a current capacity of several tens of amperes. Moreover, all of the diodes 61–65 and the discharge resistor 66 can be built into a chip of such an insulated-gate controlled semiconductor device. Since the discharge resistor 66 has a greater resistance, it should preferably be formed of the same polycrystalline silicon film that has been used for the gate film 5.

The first and second embodiments are concerned with the on-operation of the insulated-gate controlled semiconductor device, whereas the third and fourth embodiments are concerned with the off-operation thereof. Further, the fifth embodiment is concerned with the operation when the load of the semiconductor device short-circuits. The first, third, and fifth embodiments are concerned with the internal circuit arrangement, whereas the second and fourth embodiments are concerned with semiconductor construction. Obviously, the first to fifth embodiments may be implemented in various combinations.

According to the first embodiment, the constant-voltage means 61 is inserted between the field effect transistor 50 and the insulated gate 105 to supply the field effect transistor 50 with voltage resulting from dropping the gate voltage 104 applied to the gate terminal 102. Consequently, field effect transistor 50 having withstand voltage lower than the gate voltage 104 can be incorporated in the insulated-gate controlled semiconductor device. Thus, the process of manufacturing insulated-gate controlled semiconductor devices can be simplified by allowing the well of the field effect transistor to have an impurity concentration as relatively high as that in the base layer of the main body.

According to the second embodiment, the drain layer of the field effect transistor 50 is constructed so that the drain layer is formed of a composite layer with a high concentration layer 55 enclosed in a low concentration layer 56. The withstand voltage of the field effect transistor is improved by allowing a depletion layer to readily spread in the low concentration layer while the field effect transistor is held off. The composite drain layer is easily formed by thermal diffusion with impurities for use in a low concentration layer, those for use in a low concentration layer being higher in diffusion speed than impurities therefor in a high concentration layer.

According to the third embodiment, the protective diode 62 is inserted between the gate of the field effect transistor 50 and the insulated gate 105 and caused to conduct when voltage that turns off the main body 10 is applied to the insulated gate 105 in order to prevent the field effect transistor 50 from malfunctioning. Therefore, latchup is prevented from occurring while the insulated-gate controlled semiconductor device is held off.

According to the fourth embodiment, the field effect transistor 50 is enclosed with the guard ring layer 57 to have the parasitic thyristor hardly turned off by diverting carriers flowing into the well 51 to the guard ring layer 57 so as to prevent latchup of the field effect transistor.

According to the fifth embodiment, the voltage drop caused by the current detecting means is supplied, via the charging diode, to the field effect transistor solely in the direction in which the gate is charged. The current is restricted once in the main body and the current is prevented from increasing again to prohibit unnecessary oscillation by obstructing rapid discharge at the gate of the field effect transistor. This is done by using the charging diode to hold the potential of the insulated gate at low levels when the current flowing from the overload detector into the current detecting means decreases. Consequently, when the voltage drop is reduced, the potential of the insulated gate lowers while the field effect transistor is held on. The insulated-gate controlled semiconductor device is thus safely protected.

According to the sixth embodiment, the operation of the protective circuit for reducing a drive signal applied to the drive electrode in order to suppress a current when excess current flows through the main switching element is maintained even after the excess current has been suppressed. When, however, the signal applied by an external circuit to the drive terminal becomes zero or opposite in polarity, the protective circuit is reset. Hence, the main element can be controlled by means of the drive signal from that point of time. Thus, as the high-impedance state of the main element is avoided, the main element is prevented from being damaged.

The first to sixth embodiments can be implemented in combination to make it possible to provide a reliable, practical, and useful insulated-gate controlled semiconductor device capable of ensuring operations in the on and off states and is free from latchup.

The foregoing description of preferred embodiments of the present invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A short protective circuit comprising:
   a control terminal;
   a first switching element having a control electrode, a first electrode and a second electrode, said first switching element being driven by a signal applied from the control terminal to the control electrode;
   a second switching element for current detection having a control electrode, a first electrode and a second electrode, the control electrode and the first electrode of the second switching element being respectively connected to the control electrode and the first electrode of the first switching element, the second electrode of the second switching element being connected to the second electrode of the first switching element through a current detecting resistor;
   a branch circuit having a discharge switching element, said branch circuit connected to a circuit connection between the control terminal and the control electrode of the first switching element;
   means for reducing a drive signal of the first switching element by activating the discharge switching element when an excessive current flows through a current detecting resistor, said discharge switching element maintaining the reduced drive signal when the excessive current flowing through the first switching element is suppressed as the drive signal decreases; and
   means for deactivating the discharge switching element when a signal applied to the control terminal becomes zero or opposite in polarity from the drive signal after the drive signal is reduced.

2. A short protective circuit according to claim 1, wherein the drive signal is a voltage signal.

3. A short protective circuit according to claim 1, wherein the drive signal is a current signal.

4. A short protective circuit according to claim 1, wherein the discharge switching element is a MOSFET having a gate electrode.

5. A short protective circuit according to claim 4, wherein the branch circuit includes means for connecting the gate electrode of the MOSFET, the second electrode of the second switching element, and the second electrode of the first switching element, said branch circuit further including means for reducing charge time of the gate of the MOSFET and prolonging discharge time and a first diode having a first and a second terminal.

6. A short protective circuit according to claim 5, wherein the time reducing and prolonging means is a discharge resistor connected between the first diode and the second electrode of the first switching element.

7. A short protective circuit according to claim 5, wherein the MOSFET, the current detecting resistor and the discharge resistor are commonly connected to the second electrode of the first switching element through a third diode.

8. A short protective circuit according to claim 7, wherein the diodes are reverse-blocking diodes.

9. A short protective circuit according to claim 4, wherein the first terminal of the first diode is connected to the gate electrode of the MOSFET and the discharging resistor, and the second terminal of the first diode is connected to the second electrode of the second switching element.

10. A short protective circuit according to claim 1, wherein the first switching element and the second switching element are disposed on a same semiconductor substrate.

11. A short protective circuit comprising:

a control terminal;

a first switching element having a control electrode, a first electrode and a second electrode, said first switching element being driven by a signal applied from the control terminal to the control electrode;

a second switching element for current detection and having a control electrode, a first electrode and a second electrode, the control electrode and the first electrode of the second switching element being respectively connected to the control electrode and the first electrode of the first switching element, the second electrode of the second switching element being connected to the second electrode of the first switching element through a current detecting resistor;

a branch circuit having a discharge switching element, said branch circuit connected to a circuit connection between the control terminal and the control electrode of the first switching element;

means for reducing a drive signal of the first switching element by activating the discharge switching element when an excessive current flows through a current detecting resistor, said discharge switching element maintaining the reduced drive signal when the excessive current flowing through the first switching element is suppressed as the drive signal decreases; and means for deactivating the discharge switching element when a signal applied to the control terminal becomes zero or opposite in polarity from the drive signal after the drive signal is reduced, wherein the discharge switching element is a MOSFET having a gate electrode, and wherein said deactivating means includes a first diode connected between the gate of the MOSFET and the control electrode of the first switching element.

* * * * *